United States Patent
Frankot

[19]

[11] Patent Number: 6,097,328
[45] Date of Patent: Aug. 1, 2000

[54] AVERAGING-AREA-CONSTRAINED ADAPTIVE INTERFEROMETRIC FILTER THAT OPTIMIZES COMBINED COHERENT AND NONCOHERENT AVERAGING

[75] Inventor: Robert T. Frankot, Tucson, Ariz.

[73] Assignee: Raytheon Company, Lexington, Mass.

[21] Appl. No.: 09/109,834

[22] Filed: Jul. 2, 1998

[51] Int. Cl.[7] .................................................. G01S 13/90
[52] U.S. Cl. ............................ 342/25; 342/159; 342/195
[58] Field of Search .............................. 342/25, 159, 162, 342/194, 195, 196, 179

[56] References Cited

U.S. PATENT DOCUMENTS

| | | | |
|---|---|---|---|
| H1181 | 5/1993 | Rihaczek | 342/25 |
| 4,975,704 | 12/1990 | Gabriel et al. | 342/25 |
| 5,043,734 | 8/1991 | Niho | 342/25 |
| 5,248,976 | 9/1993 | Niho et al. | 342/25 |
| 5,250,952 | 10/1993 | Roth | 342/25 |
| 5,260,708 | 11/1993 | Auterman | 342/25 |
| 5,424,743 | 6/1995 | Ghiglia et al. | 342/25 |
| 5,677,693 | 10/1997 | Frankot | 342/25 |
| 5,726,656 | 3/1998 | Frankot | 342/25 |
| 5,835,055 | 11/1998 | Van Der Kooij et al. | 342/25 |

FOREIGN PATENT DOCUMENTS

| | | | |
|---|---|---|---|
| 0020517 | 7/1981 | United Kingdom | G01S 13/42 |

*Primary Examiner*—John B. Sotomayor
*Attorney, Agent, or Firm*—Leonard A. Alkov; Glenn H. Lenzen, Jr.

[57] ABSTRACT

A family of multiple scale adaptive filters and filtering methods that automatically adapt their impulse response width to local data characteristics, optimizing the accuracy, yield, and/or detail of interferometric measurements. A prefilter with fixed impulse response width is applied to a complex interferogram. The phase of the prefiltered complex interferogram is unwrapped. Then, a weighted combination of the phase-unwrapped, fixed-filtered interferograms is computed using a data-dependent criterion function. The resulting weighting function at each resolution element is typically a nonlinear function of interferogram magnitude and coherence for each fixed filter output at that resolution element.

18 Claims, 2 Drawing Sheets

AVERAGING-AREA-CONSTRAINED ADAPTIVE INTERFEROMETRIC FILTER THAT OPTIMIZES COMBINED COHERENT AND NONCOHERENT AVERAGING

BACKGROUND

The present invention relates generally to coherent computed imaging systems, and more particularly, to adaptive filters for use with coherent computed imaging systems.

Adaptive filters are used to process complex interferograms produced by synthetic array radar (SAR) systems. The prior art relating to the present invention is to apply a spatially-invariant filter to a complex interferogram (one stage of an M-stage filter depicted in FIG. 1). The disadvantage is that these fixed filters can significantly degrade accuracy in areas of high relief or high deformation gradients characterized by drastic variations in the interferometric phase gradient. U.S. Pat. No. 5,488,374, entitled "Multi-Scale Adaptive Filter for Interferometric SAR Data" and assigned to the assignee of the present invention addresses this disadvantage but does not meet the requirement for constant independent post spacing. That requirement implies that the averaging area, or effective filter impulse response width, is constant. The present invention meets this requirement while overcoming the performance disadvantages of prior art fixed filters.

Under the best of conditions, significant filtering is required in order to make reliable interferometric phase measurements for topographic mapping and other applications of interferometric synthetic aperture radar (SAR). Conventionally, a filter with fixed impulse response width is applied to the complex interferogram. However, interferometric SAR data is extremely variable in terms of signal-to-noise ratio, intrinsic coherence, as well as the level of detail and severity of the relief present in the terrain. The optimum filter width, and even the feasible filter width, can vary from one resolution element to another in areas of high relief or high deformation gradients that result in drastic variations in phase gradients. Simulation results show that an adaptive filter can significantly improve accuracy in areas of high relief.

Accordingly, it is an objective of the present invention to provide for adaptive filters for use with coherent computed imaging systems.

SUMMARY OF THE INVENTION

To meet the above and other objectives, the present invention provides for adaptive filters and filtering methods for use with coherent computed imaging systems. The adaptive filters and filtering methods support processing of interferometric phase measurements made with coherent computed imaging systems. Interferometric synthetic aperture radar (SAR) are a special case of such coherent computed imaging systems that are of particular interest and for with the present invention may be advantageously employed.

More specifically, the present invention provides for a family of multiple scale adaptive filters which automatically adjust their impulse response width to local data characteristics, optimizing the accuracy of the interferometric measurement. The adaptive filter disclosed in U.S. Pat. No. 5,488,374 is extended in accordance with the principles of the present invention to satisfy a common requirement for producing output measurements having a fixed averaging area, that is, to produce a digital elevation model (DEM) with independent posts on a uniformly-sampled grid.

To achieve this requirement, an adaptive prefilter designed to optimize coherent averaging (i.e., filter a complex interferogram) is coupled to a postfilter applied noncoherently after phase unwrapping of the complex interferogram. The postfilter adjusts its impulse response locally in inverse relation to the impulse response width of the coherent adaptive prefilter, maintaining a spatially-invariant averaging area. The present filter thus automatically adjusts the mix between coherent and noncoherent averaging to maintain the accuracy of interferometric measurements under the broadest set of conditions while satisfying a constant averaging area requirement.

The present invention may be employed in reconnaissance and remote sensing systems, such as interferometric synthetic aperture radar systems, and the like. Potential candidate systems developed by the assignee of the present invention include SIVAM, HISAR, ASARS-2, Global Hawk, ARL-M, for example. Another application relates to value-added processing to improve topographic map quality as part of commercial mapping and remote sensing services. The present invention is applicable to data from the planned Shuttle Radar Topographic Mapping mission (SRTM) which will interferometrically map the Earth, LightSAR, a smallsat concept under consideration by NASA, Intermap (a joint venture by ERIM to apply their IFSARE system commercially), ERS-1/2, and other remote sensing service capabilities that are emerging internationally. Other applications include laser metrology used in manufacturing (optical windows and mirrors for example) and magnetic resonance imaging (MRI).

BRIEF DESCRIPTION OF THE DRAWINGS

The various features and advantages of the present invention may be more readily understood with reference to the following detailed description taken in conjunction with the accompanying drawings, wherein like reference numerals represent like structural elements, and in which.

DETAILED DESCRIPTION

Figure 1:
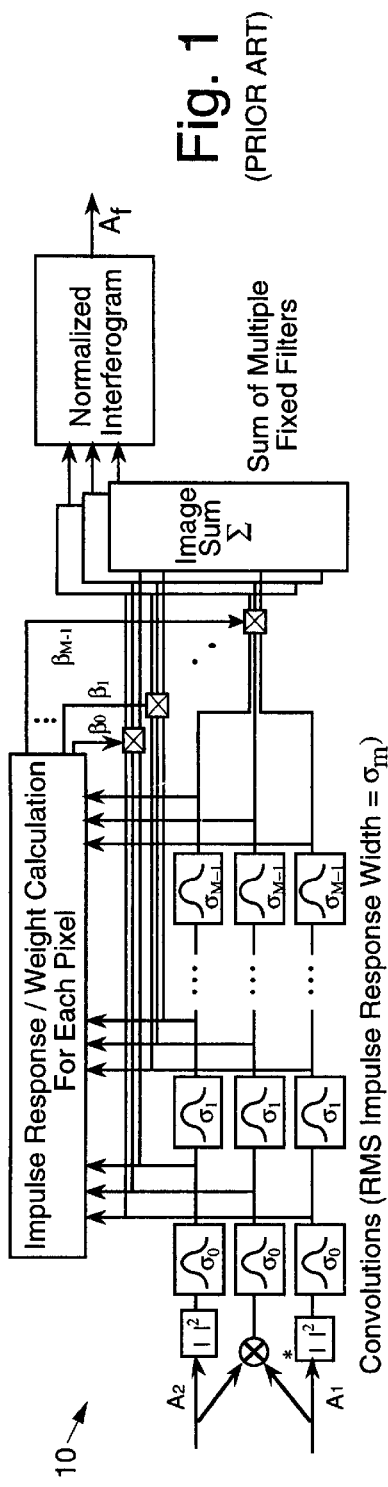
FIG. 1 shows a conventional adaptive interferometric filter corresponding to a weighted sum of fixed filters.

The present invention provides for a family of multiple scale adaptive filters that automatically adapt their impulse response width to local data characteristics, optimizing the accuracy, yield, and/or detail of interferometric measurements. For interferometric SAR, under the best of conditions, significant filtering is required in order to make reliable phase measurements in topographic mapping and other applications. Typically a filter 10 (FIG. 1) with fixed impulse response width is applied to a complex interferogram. Nonetheless, interferometric SAR data is extremely variable in terms of signal-to-noise ratio (SNR), intrinsic coherence, amount of detail and severity of the relief present in the terrain. The optimum filter width (even the feasible width) can vary from one resolution element to another in areas of high relief or high deformation gradients.

The present adaptive filter 20 (FIG. 2), or composite adaptive filter 20, uses fixed filters 10 with several filter widths to process complex interferograms, then performs a weighted combination of these fixed-filtered interferograms using a data-dependent criterion function. The data-dependent criterion function is generally disclosed in U.S. Pat. No. 5,488,374, the contents of which are incorporated herein by reference. The resulting weighting function at each resolution element is typically a nonlinear function of interferogram magnitude and coherence for each fixed filter output at that resolution element. Simulated data has been generated that show improved detail on discrete features and up to a threefold improvement in accuracy for high relief areas using the present invention.

In cases where output data are required to have a fixed averaging area, that is, to produce a digital elevation model (DEM) with independent posts on a uniformly-sampled grid, a composite adaptive filter 20 is provided to maintain a constant averaging area, and which is implemented in accordance with the principles of the present invention. A spatially-variant filter 30 (FIG. 2), or postfilter 30 slaved to the coherent adaptive filter 10 is applied noncoherently (after phase unwrapping 25). The impulse response width of the postfilter 30 varies inversely with that of the coherent adaptive filter 10 such that the composite impulse response width is spatially-invariant. To better understand the potential utility of adaptive filtering in the constant averaging area constrained case, phase accuracy is evaluated as a function of the size of the coherent portion of the composite filter and as a function of the local phase gradient.

Development of the present invention will now be discussed with specific reference to the drawing figures. Referring to FIG. 1, it shows a conventional adaptive interferometric filter 10 obtained by a weighted sum of fixed filters, referred to as a fixed interferometric filter 10. Let $A_1$ and $A_2$ be a pair of complex images to be compared interferometrically. The normalized filtered interferogram is given by:

$$A_f(i, j) = \frac{\sum_{k,l} w(k, l) A_1^*(i-k, j-l) A_2(i-k, j-l)}{\sqrt{\sum_{k,l} w(k, l)|A_1(i-k, j-l)|^2 \sum_{k,l} w(k, l)|A_2(i-k, j-l)|^2}} \quad (1)$$

where (i,j) are the pixel coordinates, e.g., for range-azimuth resolution elements, and w(k,l) is the filter impulse response which is independent of (i,j). The interferometric phase $\phi(i,j)$ is given by the phase of $A_f(i,j)$, and the correlogram, or coherence, $\mu(i,j)$ is given by the magnitude of $A_f(i,j)$. A uniformly-shaped fixed filter 10 is obtained when w a is constant over a small region, e.g., a 5-by-5 pixel area, and zero otherwise. This implements a local area average. Other fixed filter shapes may be used to obtain a weighted average, e.g., w a Gaussian shape with root-mean-square (RMS) impulse response width given by two times the standard deviation parameter for the Gaussian function. In each case, efficiencies can be gained by implementing the two dimensional (2-D) convolutions above as a cascade of 1-D convolutions, exploiting the spatial separability of common forms of w.

An adaptive interferometric filter will now be discussed. The fixed filter form of equation (1) can be extended efficiently as an adaptive filter which can greatly enhance detail, accuracy and yield in areas with highly variable detail, quality, or phase gradients. "Fixed filtering" means that the filter w(k,l) is spatially invariant, in that it is the same regardless of where in the image it is being applied, while "adaptive filtering" allows the filter to be spatially variant in a way that is dependent on the data itself. The general form for a spatially variant filter is w(k,l;i,j) for which a special case w(k,l;σ(i,j)) will be discussed, where σ is the impulse response width parameter (standard deviation in the Gaussian case) and an approximation which can be computed by a sum of simple convolutions, i.e., fixed filters, each with different widths giving:

$$A_f(i, j; \underline{\beta}(i, j)) = \frac{\sum_m \beta_m \sum_{k,l} w(k, l; \sigma_m) A_1^*(i-k, j-l) A_2(i-k, j-l)}{\sqrt{\sum_m \beta_m \sum_{k,l} w(k, l; \sigma_m)|A_1(i-k, j-l)|^2 \sum_m \beta_m \sum_{k,l} w(k, l; \sigma_m)|A_2(i-k, j-l)|^2}} \quad (2)$$

where $\underline{\beta}=\beta_m, m=0, \ldots, M-1$ is a weighting function that emphasizes the "best" out of a family of spatially-invariant impulse response widths $\sigma_m$. The latter filter form is computed efficiently using spatially-separable and-invariant filters. The filter can also be realized using a multiscale pyramid where the mth filter stage is computed from the (m–1)th filter stage using an identical filtering and decimation process disclosed in U.S. Pat. No. 5,488,374.

The parameter functions σ or $\beta_m$ are functions of some statistic taken on $A_1$ and $A_2$, generally byproducts of the filtering itself such as $\mu(i,j; \sigma)=|A_f(i,j; \sigma)|$, the coherence achieved with the particular filter size. The weighting function $\beta_m(i,j)$ at each sample (i,j) has been constructed as a simple nonlinear function of the intermediate fixed-filtered interferograms at that same sample, resulting in a simple and efficient structure as illustrated in FIG. 1. The weighting function is designed to locally weight the filter width to optimize (approximately) a criterion function. A number of criterion functions have been employed including maximum coherence, maximum nonnormalized interferogram magnitude, and minimum phase error.

The desired tendency is to smooth more in areas of low coherence whether due to temporal change, volume scattering effects, or low SNR, and to smooth less in areas of high coherence or high detail/relief (where low coherence is merely an artifact of a large fixed filter). The simulation examples are representative of several such effects.

Figure 2:
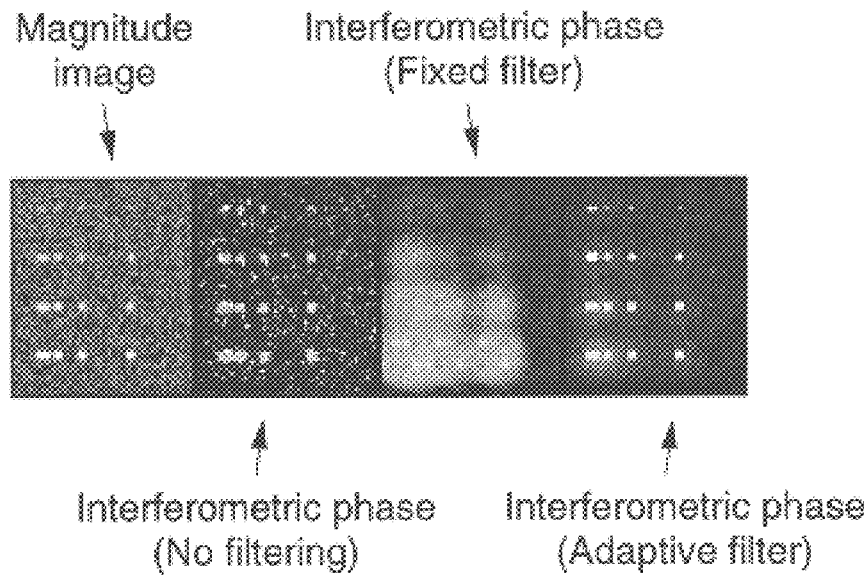
FIG. 2 shows that an adaptive filter produces improved detail relating to discrete features without impacting smooth terrain.

Simulation results will now be discussed. FIG. 2 shows a simulated set of discrete trihedral scatterers elevated above flat terrain where the adaptive filter preserves detail in areas of high SNR while adequately filtering nearby smooth terrain. Even a very high quality two-channel SAR interferometer can have significant areas of reduced coherence due to pixels that happen to having lower than average backscatter due to scintillation, surface slope variations, and albedo variations. The raw phase difference shows very large phase errors simply due to scintillation effects and thermal noise level 10 dB below the average terrain. The maximum sized fixed filter ($\sigma_m=4$ resulting in an eight pixel two-sided RMS impulse response width) improves the phase measurement on smooth terrain at a cost of resolution, seriously degrading the ability to distinguish individual features. The present adaptive filter cleans up the phase where needed yet preserves most of the detail on the discrete features. The maximum nonnormalized interferogram criterion was used in FIG. 2, but other criteria achieved similar results.

Figure 3:
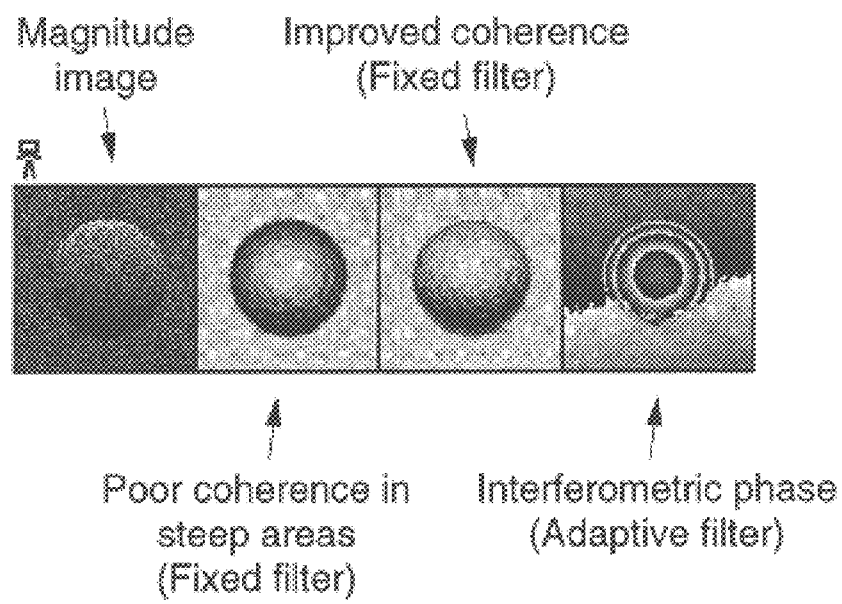
FIG. 3 illustrates increased coherence obtained using an adaptive filter resulting in a threefold improvement in RMS phase error in high-relief areas.

FIG. 3 shows a simulated hill protruding above a flat surface. Magnitude variations are only due to surface slope variations and speckle. Here the nominal fixed filter is not usable in high relief areas because the high phase gradient, with fringes only five pixels apart, approaches the filter width (four pixels two-sided RMS). Areas of low but finite SNR require a much wider filter than is feasible for the high-relief areas. This includes nonshadowed parts of the backside of the hill and, as in FIG. 2, pixels which have scintillated downward. The feasible filter width is, therefore, spatially variant. Here, the adaptive filter increases coherence in the steep areas from 0.3 to 0.7 while maintaining the average coherence in the flat areas at 0.91, the value implied by the 10 dB average SNR. This implies a threefold reduction in RMS phase error in steep areas, without degradation of smooth areas.

Figure 4:
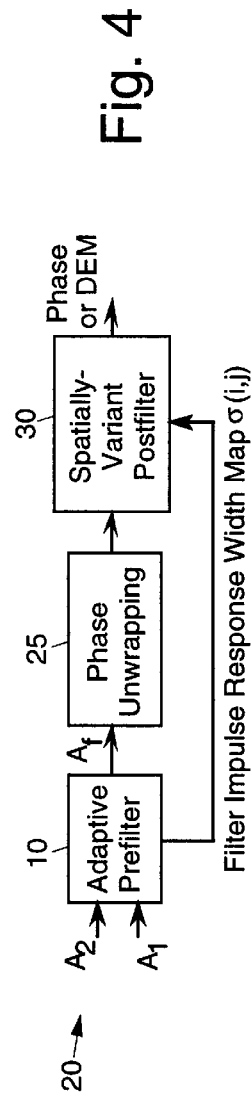
FIG. 4 illustrates the use of a spatially-variant postfilter slaved to the adaptive filter to obtain constant averaging area to produce an adaptive filter in accordance with the principles of the present invention.

If a fixed independent post spacing requirement is imposed, in DEM production for example, this implies a constant averaging area constraint, constant impulse response or bandwidth. An adaptive filter satisfying that constraint can be realized in accordance with the present invention by adaptively selecting the mix between coherent averaging (filtering of the complex interferogram) and noncoherent averaging (filtering of unwrapped phase). This is illustrated in FIG. 4, where the coherent prefilter includes an adaptive filter of the form already described, a coherent filter map $\sigma(i,j)$ which indicates the coherent filter impulse response width used for each resolution element and a noncoherent postfilter that is slaved to the adaptive filter, adjusting its impulse response width according to the coherent filter map to maintain a constant composite impulse response width.

Figure 5:
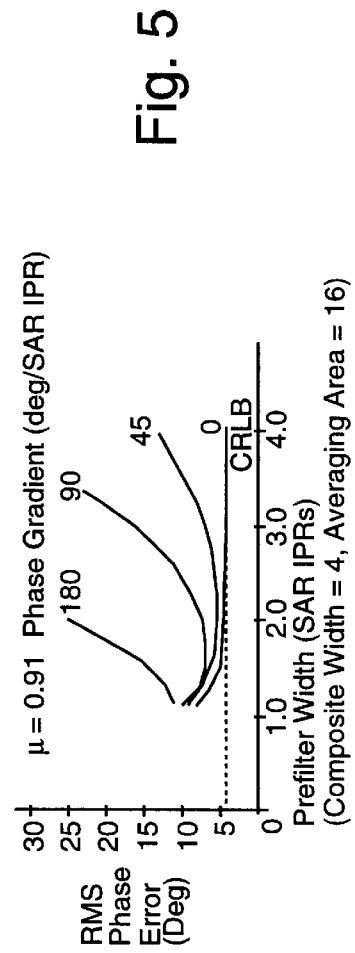
FIG. 5 illustrates phase measurement accuracy for FIG. 4 as a function of fixed prefilter width, and wherein optimally adapting the prefilter width significantly reduces phase error.

FIG. 5 shows a plot of phase measurement accuracy as a function coherent filter size when such a composite filter arrangement is used. FIG. 5 shows the accuracy degrading precipitously when the coherent filter width encompasses one half cycle or more of interferometric phase variation. The effects of gross phase unwrapping errors, such as wrong cycle multiple, may be peculiar to the particular phase unwrapping algorithm and are not included here even though such errors likely change the shape of the indicated accuracy curves. The coherence-maximization form of the adaptive filter automatically maintains the coherent portion of the filter width near the minimum value of those curves. In this example, the effective averaging area is $N^2=16$ SAR resolution elements where $N^2$ is the effective number of independent samples averaged. This produces a DEM with the same independent post spacing as that achieved with a fixed 4-by-4 rectangular filter but with improved results in areas of high relief. For example, FIG. 5 shows a threefold reduction in phase error in areas with a moderate 45 degree phase gradient would be achieved by reducing the coherent impulse response width from 4.0 to 2.0.

The present invention thus provides for a family of adaptive filtering methods for interferometry have been disclosed along with simulation examples showing improved detail and phase measurement accuracy. Moreover, these adaptive filters provide a benefit even when the averaging area is constrained to equal a constant DEM post spacing. Efficient realization of the filters require only slightly more computation than standard fixed weighted filters.

Thus, improved adaptive filters for use with coherent computed imaging systems have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. An adaptive filter for use in a coherent computed imaging system, comprising:
   a coherent adaptive prefilter comprising a plurality of fixed filters each having a predetermined filter width for producing a coherently filtered complex interferogram;
   a phase unwrapping circuit for unwrapping the phase of the coherently filtered complex interferogram; and
   an adaptive noncoherent complementary postfilter for performing a weighted combination of the phase-unwrapped, fixed-filtered interferograms using a predetermined data-dependent criterion function.

2. The adaptive filter of claim 1 wherein the coherent adaptive prefilter outputs a filter impulse response map that is coupled to the adaptive postfilter.

3. The adaptive filter of claim 1 wherein the adaptive noncoherent complementary postfilter comprises a spatially-variant filter whose impulse response width varies inversely with the impulse response width of the coherent adaptive prefilter to produce a composite impulse response width that is spatially-invariant.

4. The adaptive filter of claim 1 wherein the coherent adaptive prefilter comprises a uniformly-shaped fixed filter.

5. The adaptive filter of claim 1 wherein the coherent adaptive prefilter comprises a Gaussian shape with a root-mean-square impulse response width.

6. The adaptive filter of claim 5 wherein the root-mean-square impulse response width is given by two times the standard deviation parameter for the Gaussian function.

7. An adaptive filter comprising:
   A coherent adaptive filter having a predetermined impulse response width for filtering a complex interferogram;
   phase unwrapping means for unwrapping the phase of the coherently filtered complex interferogram; and
   a noncoherent complementary filter for filtering the phased unwrapped coherently filtered interferogram to adjust its impulse response locally in inverse relation to the impulse response width of the coherent adaptive filter, to automatically adjust the mix between coherent and noncoherent averaging to maintain a spatially-invariant averaging area.

8. The adaptive filter of claim 7 wherein the coherent adaptive filter outputs a filter impulse response map that is coupled to the noncoherent complementary filter.

9. The adaptive filter of claim 7 wherein the adaptive noncoherent complementary filter comprises a spatially-variant filter whose impulse response width varies inversely with the impulse response width of the coherent adaptive prefilter to produce a composite impulse response width that is spatially-invariant.

10. The adaptive filter of claim 7 wherein the coherent adaptive filter comprises a uniformly-shaped fixed filter.

11. The adaptive filter of claim 7 wherein the coherent adaptive filter comprises a Gaussian shape with a root-mean-square impulse response width.

12. The adaptive filter of claim 11 wherein the root-mean-square impulse response width is given by two times the standard deviation parameter for the Gaussian function.

13. An adaptive filtering method comprising the steps of:

adaptively filtering interferometric data using a plurality of fixed filters that each having a predetermined filter width to produce a coherently filtered complex interferogram;

unwrapping the phase of the coherently filtered complex interferogram; and computing a weighted combination of the phase-unwrapped, fixed-filtered interferograms using a predetermined data-dependent criterion function.

14. The method of claim 13 wherein the adaptive filtering step outputs a filter impulse response map that is used to compute the weighted combination of the phase-unwrapped, fixed-filtered interferograms.

15. The method of claim 13 wherein the computing step comprises the step of filtering the interferograms using a filter whose impulse response width varies inversely with the impulse response width used in the adaptively filtering step to produce a composite impulse response width that is spatially-invariant.

16. The method of claim 13 wherein the adaptive filtering step comprises the step of using a uniformly-shaped fixed filter.

17. The method of claim 13 wherein the adaptive filtering step comprises the step of using a Gaussian shape with a root-mean-square impulse response width.

18. The method of claim 17 wherein the root-mean-square impulse response width is given by two times the standard deviation parameter for the Gaussian function.

* * * * *